(12) United States Patent
Samudra et al.

(10) Patent No.: US 11,860,751 B1
(45) Date of Patent: Jan. 2, 2024

(54) DETERMINISTIC DATA LATENCY IN SERIALIZER/DESERIALIZER-BASED DESIGN FOR TEST SYSTEMS

(71) Applicant: Synopsys, Inc., Mountain View, CA (US)

(72) Inventors: Abhijeet Samudra, Sunnyvale, CA (US); Ajay Nagarandal, Sunnyvale, CA (US); Anubhav Sinha, Hyderabad (IN); Luis M. Cruz, Maia (PT); Milin Kaushik Raijada, Hyderabad (IN); Ramalingam Kolisetti, Hyderabad (IN); Naresh Thakur, Hyderabad (IN); Saransh Nagaich, Bangalore (IN); Jatin Verma, Hyderabad (IN)

(73) Assignee: Synopsys, Inc., Sunnyvale, CA (US)

( * ) Notice: Subject to any disclaimer, the term of this patent is extended or adjusted under 35 U.S.C. 154(b) by 63 days.

(21) Appl. No.: 17/843,231

(22) Filed: Jun. 17, 2022

Related U.S. Application Data (60) Provisional application No. 63/212,517, filed on Jun. 18, 2021.

(51) Int. Cl.
| | | |
|---|---|---|
| *G06F 11/00* | (2006.01) | |
| *G06F 11/263* | (2006.01) | |
| *G06F 11/22* | (2006.01) | |
| *G01R 31/317* | (2006.01) | |
| *G01R 31/3183* | (2006.01) | |

(52) U.S. Cl.
CPC .......... *G06F 11/263* (2013.01); *G01R 31/317* (2013.01); *G01R 31/3183* (2013.01); *G01R 31/318307* (2013.01); *G06F 11/2268* (2013.01)

(58) Field of Classification Search
None
See application file for complete search history.

(56) References Cited

U.S. PATENT DOCUMENTS

| | | | |
|---|---|---|---|
| 7,917,319 B2 * | 3/2011 | Hafed | G01R 31/31858 702/69 |
| 2010/0313089 A1 * | 12/2010 | Rajski | G01R 31/318547 714/E11.155 |
| 2014/0189452 A1 * | 7/2014 | Sonawane | G01R 31/318552 714/727 |
| 2014/0189455 A1 * | 7/2014 | Sonawane | G01R 31/318552 714/731 |
| 2015/0067426 A1 * | 3/2015 | Nardini | G01R 31/318385 714/727 |
| 2017/0115353 A1 * | 4/2017 | Sonawane | G01R 31/2803 |
| 2018/0306862 A1 * | 10/2018 | Qian | G01R 31/318572 |

* cited by examiner

*Primary Examiner* — Mujtaba M Chaudry
(74) *Attorney, Agent, or Firm* — Park, Vaughan, Fleming & Dowler LLP; Laxman Sahasrabuddhe (57) ABSTRACT

Test packets may be received at a design under test (DUT) from an automated test equipment (ATE) over a serializer/deserializer (SERDES) connection between the ATE and the DUT. The test packets may include test pattern data to test the DUT. The test pattern data may be applied to the DUT using a set of scan chains and test response data corresponding to the test pattern data may be obtained. The test response data may be received by a circuit in the DUT at irregular time intervals. Response packets may be sent to the ATE by the circuit in the DUT at regular time intervals, where the response packets may include a portion of the test response data (which may be encoded using an encoding technique), and where the response packets may be sent to ATE over the SERDES connection.

20 Claims, 6 Drawing Sheets

DETERMINISTIC DATA LATENCY IN SERIALIZER/DESERIALIZER-BASED DESIGN FOR TEST SYSTEMS

RELATED APPLICATION

This application claims the benefit of U.S. Provisional Application Ser. No. 63/212,517, filed on 18 Jun. 2021, the contents of which are herein incorporated by reference in their entirety for all purposes.

TECHNICAL FIELD

The present disclosure generally relates to integrated circuit (IC) design and test. More specifically, the present disclosure relates to deterministic data latency in serializer/deserializer (SERDES) based design for test (DFT) systems.

BACKGROUND

Testing IC designs is important to ensure that the IC designs operate as desired. An IC design that is desired to be tested may be referred to as a device under test or design under test (DUT). A DUT may include DFT circuitry to facilitate testing. The DFT circuitry may include scan chains which may be used to scan in test stimuli and scan out test responses.

SUMMARY

Embodiments described herein may feature a SERDES-based DFT system with deterministic data latency. Test packets which include test pattern data to test a DUT may be received from an automated test equipment (ATE). The test packets may be received over a high speed SERDES connection between the ATE and the DUT. The SERDES connection may include one or more high speed input/output (I/O) lanes. The test pattern data may be applied to the DUT using a set of scan chains and test response data corresponding to the test pattern data may be obtained. The test response data may be received by a circuit in the DUT at irregular time intervals. The circuit in the DUT may send response packets to the ATE at regular time intervals, where the response packet may include a portion of the test response data, and where the response packets may be sent to the ATE over the SERDES connection.

In some embodiments described herein, the response packets may include encoded test response data which is obtained by encoding the portion of the test response data, where the encoding may map a first set of bits to a second set of bits, where the number of bits in the second set of bits may be greater than the number of bits in the first set of bits, where each bit in the first set of bits may be mapped to one or more corresponding bits in the second set of bits, and where a don't care bit in the first set of bits may be mapped to corresponding one or more don't care bits in the second set of bits. In some embodiments described herein, the ATE may compare the encoded test response data with corresponding encoded expected response data.

In some embodiments described herein, the regular time intervals may be controlled by a timer circuit in the DUT. Specifically, a configuration packet may be received from the ATE, where the configuration packet may include a timer value corresponding to the regular time intervals. The timer circuit may then be configured and/or programmed based on the timer value (e.g., by storing the timer value in a register associated with the timer circuit). The timer value may include a safety margin which is based on an amount of irregularity of the irregular time intervals.

In some embodiments described herein, a configuration packet may be received from the ATE which includes a response data size value. The portion of the test response data may be determined or controlled based on the response data size value.

BRIEF DESCRIPTION OF THE FIGURES

The disclosure can be understood based on the detailed description given below and the accompanying figures. The figures, examples and embodiments are for illustrative purposes, and do not limit the scope of the disclosure. Furthermore, the figures are not necessarily drawn to scale.

DETAILED DESCRIPTION

A DUT which includes DFT circuitry may be tested by applying test patterns (which may be generated by using Automatic Test Pattern Generation (ATPG)) to the DUT, and comparing responses generated by the DUT with expected responses. A test fails when a response generated by the DUT does not match an expected response.

Some ATE may drive test patterns into the DUT and sample the responses via general purpose I/O (GPIO) pins. The responses may be sampled and compared at specific cycles. One or more cycles can have one or more bits of the response value as "don't care," i.e., these bits are not compared. The frequency of operation of the GPIOs may be low (e.g., in the order of 100 megabits/sec). The size of a test pattern may refer to the number of bits in the test pattern. With growing chip sizes and complexity of the DUTs, the size of test patterns is increasing. An ATE that uses GPIOs may need a large number of GPIO pins to handle large-sized test patterns and keep the test time reasonable. However, a limited number of GPIO pins may be available on the chip. Thus, an ATE may not be able to test a large and complex DUT in a reasonable amount of time by driving large-sized patterns via GPIO pins.

An alternative to using GPIO pins is to use high speed I/Os, such as SERDES based I/O, which may already be part of the functional operation of the chip. Using a SERDES-based I/O, an ATE can drive signals at high speeds (e.g., gigabits/sec). However, a SERDES-based I/O may operate on packetized data. The term "packetized data" may refer to data that is represented and/or stored using a packet format. In addition, the data may be encoded to achieve transition density and electrical balance (e.g., using encoding schemes such as 8b/10b). A SERDES-based I/O may use encoding and packetizing circuitry at the transmitter, and decoding and depacketization circuitry at the receiver. Packet-based protocols used by a SERDES-based I/O may inherently cause non-deterministic flow of packets across the SERDES-based link between the ATE and the DUT because of built-in mechanisms in the packet-based protocols to handle traffic conditions. Thus, some ATE systems that use SERDES-based I/O may use specialized circuitry at transmitters and receivers and may generate responses to test stimuli that are non-deterministic in time (due to packet-based protocols) and value (due to encoding schemes that make it impossible or difficult to use "don't care" bits).

Embodiments described herein feature circuitry to provide deterministic data latency in SERDES-based DFT systems. Embodiments described herein may use a combination of techniques which include, but are not limited to, (1) an encoding technique which eliminates the need for decoding circuitry, and (2) a packet processing technique to achieve deterministic timing of response packets. Advantages of embodiments described herein include, but are not limited to, (1) allowing a DUT to be tested using large test patterns via a high speed I/O interface that uses a small number of pins on the DUT, and (2) not requiring the ATE to include packet processing circuitry. The number of pins on the DUT is limited. Thus, using fewer pins on the DUT for testing is advantageous because it allows more pins to be used for other purposes. Requiring ATEs to use packet processing circuitry increases the cost and complexity of the ATE and prevents ATEs that do not include packet processing circuitry from being used. Thus, it is advantageous to enable the ATE to test DUTs via a high speed I/O interface without requiring the ATE to use packet processing circuitry because it allows existing ATEs (which may not include packet processing circuitry) to be used and avoids increasing the cost and complexity of ATEs.

Figure 1:
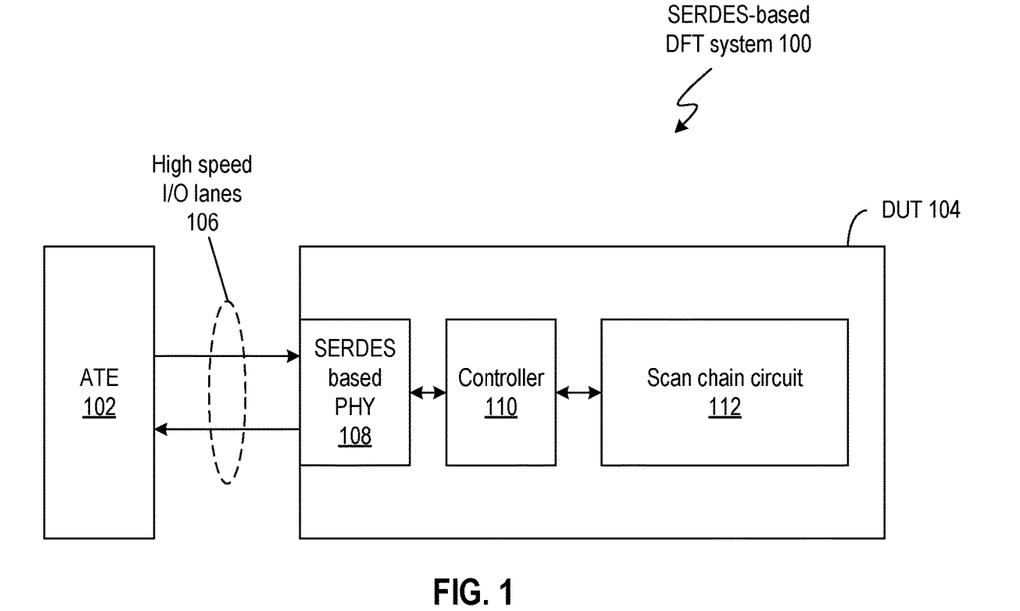
FIG. 1 illustrates a SERDES-based DFT system in accordance with some embodiments described herein.

FIG. 1 illustrates a SERDES-based DFT system in accordance with some embodiments described herein.

SERDES-based DFT system 100 may include ATE 102 that is used to test DUT 104. The connection between ATE 102 and DUT 104 may include a set of high speed I/O lanes 106, which may be connected to SERDES-based physical layer (PHY) circuit 108 in DUT 104. Set of high speed I/O lanes 106 may include one or more connections that can be operated at a high speed (e.g., gigabits/sec). Controller 110 may interface SERDES-based PHY 108 and scan chain circuit 112. Scan chain circuit 112 may include, among other things, a set of scan chains, circuitry to scan-in data into the set of scan chains, and circuitry to scan-out data from the set of scan chains. ATE 102 may provide packetized test patterns to DUT 104 and receive packetized test responses from DUT 104 over high speed I/O lanes 106.

Figure 2:
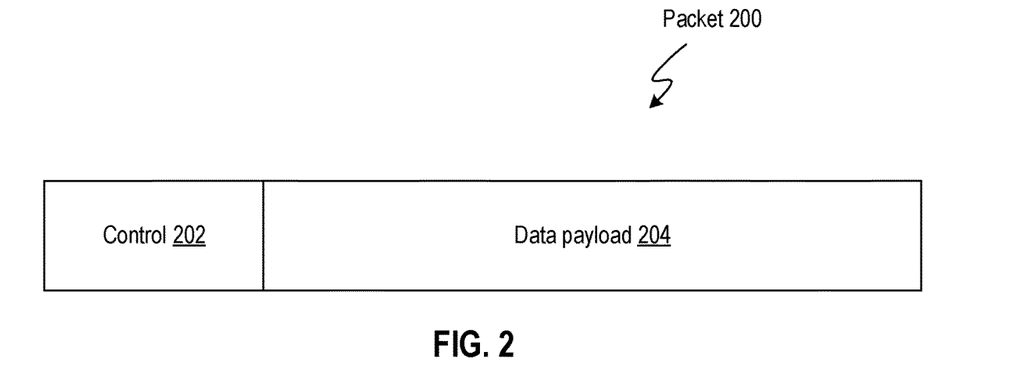
FIG. 2 illustrates a packet format in accordance with some embodiments described herein.

FIG. 2 illustrates a packet format in accordance with some embodiments described herein.

Packet 200 may generally include control section 202 (which may also be referred to as a "header") and data payload section 204. Control section 202 may include information that may be used for configuring controller 110 or scan chain circuit 112, and data payload section 204 may include the test patterns or test responses. The sizes of control section 202 and data payload section 204 and the interpretation of the bits in control section 202 may depend on the packetization format. Although not shown in FIG. 2, a packet may also include an integrity section (e.g., cyclic redundancy check bits) and packet delineation sections, e.g., start of packet (SOP) bytes to indicate the beginning of a packet and end of packet (EOP) bytes to indicate the end of the packet. Packets may be of varying sizes and the gap between packets (inter-packet gap or IPG) may also vary. In some embodiments described herein, the packet format may conform to the Institute of Electrical and Electronic Engineers (IEEE) 1149.10 standard.

In FIG. 1, the interface circuit in ATE 102 that drives high speed I/O lanes 106 may not include packet processing circuitry. Instead, the interface circuit in ATE 102 may be unaware of the packetization format and treat the packetized data as a set of bits. Packetized test patterns sent by ATE 102 to DUT 104 may be unpacked by controller 110. Controller 110 may use the control information (which may be in control section 202) in the packet to determine the type of packet, and perform one or more configuration operations and/or provide the unpacked test patterns (which may be in the data payload section 204) to scan chain circuit 112. Next, controller 110 may receive test responses from scan chain circuit 112. Controller 110 may then packetize the test responses and send the packetized test responses to ATE 102 over high speed I/O lanes 106.

Figure 3:
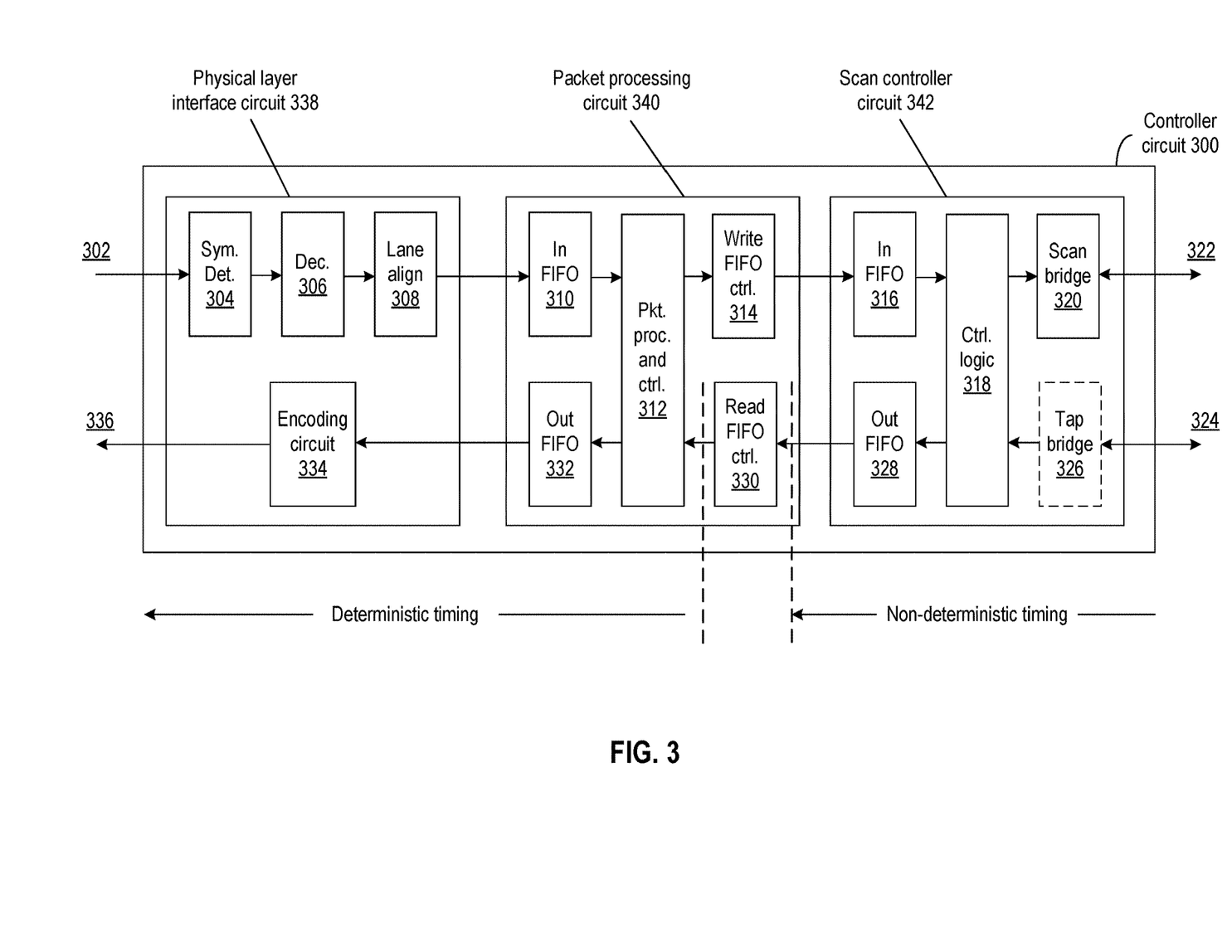
FIG. 3 illustrates a controller circuit in accordance with some embodiments described herein.

FIG. 3 illustrates a controller circuit in accordance with some embodiments described herein.

Controller circuit 300 (which may correspond to controller 110) may include physical layer interface circuit 338, packet processing circuit 340, and scan controller circuit 342. On the inbound path, controller circuit 300 may receive packetized data 302 from a PHY circuit (e.g., PHY circuit 108 in FIG. 1) and use control and data signals 322 to provide data to a scan chain circuit (e.g., scan chain circuit 112). Control and data signals 322 may include, but are not limited to, a clock signal and test pattern data signals that are scanned into the scan chains. On the outbound path, controller circuit 300 may use control and data signals 324 to receive data from the scan chain circuit (e.g., scan chain circuit 112) and provide packetized data 336 to the PHY circuit (e.g., PHY circuit 108 in FIG. 1). Control and data signals 324 may include, but are not limited to, a clock signal and test response data signals that are scanned out of the scan chains.

On the inbound path, physical layer interface circuit 338 may include symbol detection circuit 304, decoder 306, and lane alignment circuit 308. Packetized data 302 may be received from a PHY as a voltage signal. Symbol detection circuit 304 may detect symbols in the voltage signal and provide a sequence of symbols (e.g., bits) to decoder 306. Decoder 306 may decode the symbols to undo any encoding that was performed by an ATE (e.g., ATE 102). The symbols may be received on a set of parallel lanes, and lane alignment circuit 308 may synchronize the symbols across the set of parallel lanes. Lane alignment circuit 308 may provide packetized data to packet processing circuit 340 for further processing.

Packet processing circuit 340 may include input first-in-first-out buffer (FIFO) 310 to store packetized data received from physical layer interface circuit 338 (e.g., from lane alignment circuit 308). Packetized data stored in input FIFO 310 may be processed by packet processing controller circuit 312. Specifically, packet processing controller circuit 312 may perform integrity checks on the packetized data (e.g., a cyclic redundancy checks) and extract information about the packet contents. Packet processing controller circuit 312 may use a control section in the packet (e.g., control section 202 in FIG. 2) to determine the type of the packet. Depending on the type of packet, the packet may be consumed by packet processing controller circuit 312 or forwarded to scan controller circuit 342.

For example, packet processing controller circuit 312 may determine whether the packet is a "CONFIG/TARGET"

packet (e.g., as defined in the IEEE 1149.10 standard). If packet processing controller circuit 312 determines that the packet is a "CONFIG/TARGET" packet, then packet processing controller circuit 312 may consume the packet, i.e., the contents of the packet (e.g., content section 202 and/or data payload section 204) may be used by packet processing controller circuit 312 to configure one or more registers in controller circuit 300. For such packets, an appropriate response packet may be generated and sent back to the ATE via the outbound path. On the other hand, if packet processing controller circuit 312 determines that the packet includes information for the scan controller circuit 342, then the contents of the packet may be extracted and provided to write FIFO controller 314, which may write the packet contents to input FIFO 316 in scan controller circuit 342.

Scan controller circuit 342 may include control logic 318 which may use the packet contents stored in input FIFO 316 to operate the scan chain circuit (e.g., scan chain circuit 112 in FIG. 1) via scan bridge 320. The packet contents may include scan data (e.g., data that is desired to be scanned into the scan cells) and scan control and clocking information (e.g., information about how many shift cycles to use for scanning in the data). Specifically, control logic 318 may read data from input FIFO 316 and generate scan data, control signals, clock signals. The rate at which control logic 318 reads out data from input FIFO 316 may depend on the rate at which the scan chain circuit (e.g., scan chain circuit 112 in FIG. 1) can consume the data. Control logic 318 may insert no operation (NOP) or stall cycles if the scan chain circuit (e.g., scan chain circuit 112 in FIG. 1) does not consume the scan content quickly enough.

In some embodiments, control logic 318 may use tap bridge 326 to sample pattern responses (which may be referred to "scan results") from control and data signals 324. In other embodiments, control logic 318 may directly sample pattern responses from control and data signals 324. The scan result data may be stored in output FIFO 328. Depending on the scan configuration, each shift cycle may cause one or more scan data items to be written into output FIFO 328. Specifically, in some configurations, multiple scan outputs may be combined into a single scan data item which may be written to the output FIFO 328. Thus, different amounts of time may be used to sample and store scan results in output FIFO 328. In other words, the scan result data may become available in output FIFO 328 with non-deterministic timing (which is shown in FIG. 3 with the label "non-deterministic timing").

Some ATEs may require that a fixed time duration exist between the time when a test pattern is provided to a DUT and a test response is received from the DUT. For example, in FIG. 1, ATE 102 may begin transmitting a test pattern to DUT at clock cycle C1, and expect to receive a test response in cycle C2 (multiple clock cycles may exist between C1 and C2). ATE 102 may require cycle-level synchronization between the test pattern and test response to ensure that the test response is compared with the corresponding expected response. ATE 102 may not be able to test DUT 104 if the timing of the test response is off by even one cycle.

In a SERDES-based DFT system, scan data is communicated and processed using packets. Packet-based protocols may not rely on packets arriving at fixed time intervals. Instead, packet-based protocols may expect packets to arrive within a predictable time window. Thus, packet-based protocols may inherently create non-deterministic packet arrival times. Other factors may also cause the packet arrival times to be non-deterministic. For example, the process of recovering the data from a SERDES interface may involve clock recovery. The data received from the SERDES interface may be interpreted using the recovered clock and may be further processed using an internal clock which may be different from recovered clock. Thus, the time between when an ATE transmits a test pattern to a DUT over an SERDES interface and when the DUT recovers the received data may not be fixed. Thus, an ATE may not be able to use packet-based protocols if the ATE requires a fixed time duration (e.g., at a cycle-level resolution) between the time when a test pattern is provided to a DUT and a test response is received from the DUT.

Additionally, SERDES interfaces may encode data transmitted over a high speed I/O lane to maintain desirable electrical characteristics on the lines (e.g., DC balance and noise suppression) and to ensure that enough transitions occur within a given duration to facilitate clock and data recovery at the receiver. A side benefit of these encoding schemes is to provide special control characters, which may be used to demarcate packet boundaries (e.g., start of packet and end of packet). Some special control characters may be used to implement specific SERDES functionality (e.g., during an initial training phase in a SERDES protocol, special characters may be used as markers for lane alignment). Additionally, the special characters may also be used for clock correction and synchronization.

If data is desired to be communicated between the ATE and the DUT using such encoding, then both the ATE and the DUT may require encoding and decoding circuitry. For example, a popular encoding scheme called "8b/10b" maps each 8-bit data word to a corresponding 10-bit word. In this scheme, modifying a single bit in an 8-bit word may cause the corresponding 10-bit word to be completely different. The scan result may include one or more bits which are "don't care" or "X" bits. The scan result in don't care bits are ignored when the scan result is compared with the expected response. In other words, the scan result is valid regardless of whether a don't care bit is a 0 or a 1. However, because 8b/10b encoding can completely transform the bit values, the 10b words corresponding to a don't care being a 0 or a 1 can be completely different. Thus, an ATE may require the test response (which may be received as a 10b word encoded according to the 8b/10b encoding scheme) to be decoded back into an 8b word before the ATE can compare the test response with an expected response. However, this approach requires the ATE to include 8b/10b encoding and decoding circuitry, which is undesirable.

Some embodiments described herein use a data encoding technique which allows don't care bits to be compared using the encoded word (e.g., a 10-bit word), i.e., the data encoding technique does not require the encoded word to be decoded (e.g., without decoding the 10-bit word into an 8-bit word) for comparison with an expected response. In other words, the encoded test response (e.g., 10-bit word test response) may be directly compared (i.e., without performing a decoding operation) with an expected response (e.g., a 10-bit word that represents an 8-bit expected response), and the comparison allows don't care bits to be used. These embodiments do not require a decoding circuit in the ATE because the encoded test responses can be directly compared with corresponding expected responses. The data encoding technique may support a desired transition density to allow clock-and-data recovery to operate (e.g., the data encoding technique may limit the run-lengths to be less than a threshold value).

Specifically, some embodiments described herein may perform the encoding as follows. Let an 8-bit word be represented by the letters "abcdefgh," where each letter corresponds to a bit. Specifically, the letter "a" may represent the first bit (which may be the most significant bit) and the letter "h" may represent the eighth bit (which may be the least significant bit). The encoded 10-bit word may be generated by inverting the first bit and the fifth bit. Thus, the 10-bit word may be represented by "$\bar{a}$abcd$\bar{e}$efgh," where "$\bar{a}$" may refer to the inverse of bit "a" and "$\bar{e}$" may refer to the inverse of bit "e." In this encoding technique, special symbols may be generated by not inverting the first and fifth bits. Thus, special symbols may have the format "aabcdeefgh."

For example, let the 8-bit word "00010001" represent a test pattern and the 8-bit word "X000X000" represent the expected response. Using the above-described technique, the corresponding 10-bit encoded words for the test pattern and the expected response are "1000110001" and "XX000XX000," respectively. An ATE (e.g., ATE 102 in FIG. 1) may send the 10-bit word "1000110001" to a DUT (e.g., DUT 104 in FIG. 1), and may receive a 10-bit test response, which may be directly compared with the expected response "XX000XX000."

In general, embodiments described herein may use an encoding technique that maps each bit in an m-bit word to one or more corresponding bits in an n-bit word (where n is greater than m), so that changing the value of a single bit in the m-bit word only changes the values of the corresponding bits in the n-bit word. The encoding technique ensures that a don't care bit in the m-bit word (which corresponds to a single bit in the m-bit word having either a 0 or a 1 value) directly maps to the corresponding bits in the n-bit word which may be interpreted as don't care bits. Thus, don't care bits in the test response may be directly compared with the expected response without decoding the test response.

In FIG. 3, on the outbound path, the scan results stored in output FIFO 328 may be read by read FIFO control circuit 330 and provided to packet processing and control circuit 312 for packetization, which may store the packet in output FIFO 332. Encoding circuit 334 may read the packet from output FIFO 332, encode the packet, and provide packetized data 336 to the PHY circuit (e.g., PHY circuit 108 in FIG. 1).

On the outbound path, the delay from the output of read FIFO control circuit 330 to PHY circuit is deterministic. In some embodiments described herein, read FIFO control circuit 330 reads a specific amount of data (e.g., the amount of data required for creating a single scan response packet) from output FIFO 328 at fixed intervals, thereby causing the scan response packets to be sent back to the ATE with deterministic timing, i.e., at fixed intervals. Thus, read FIFO control circuit 330 ensures that packets are sent to the PHY circuit with deterministic timing even though the scan response data may arrive at output FIFO 328 with non-deterministic timing.

In some embodiments described herein, read FIFO control circuit 330 may include a timer circuit to control when data is read from output FIFO 328. The timer circuit may be programmable. Specifically, a value stored in a register may control the duration of the timer, and the register value may be programmed as part of the initial setup.

Figure 4:
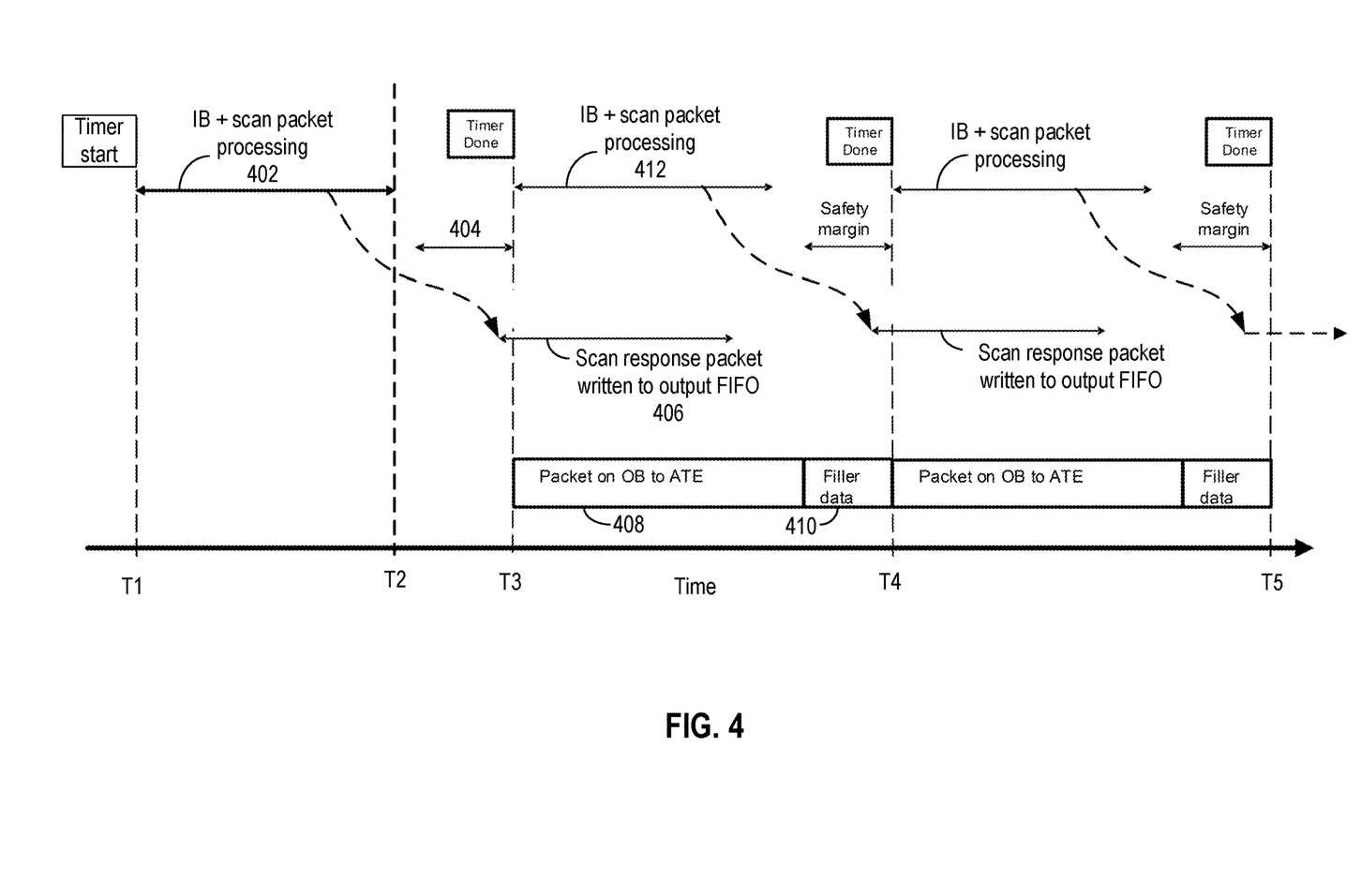
FIGS. 4-5 illustrate a timing diagram with deterministic latency in accordance with some embodiments described herein. The X-axis in FIGS. 4-5 corresponds to time.
Figure 5:
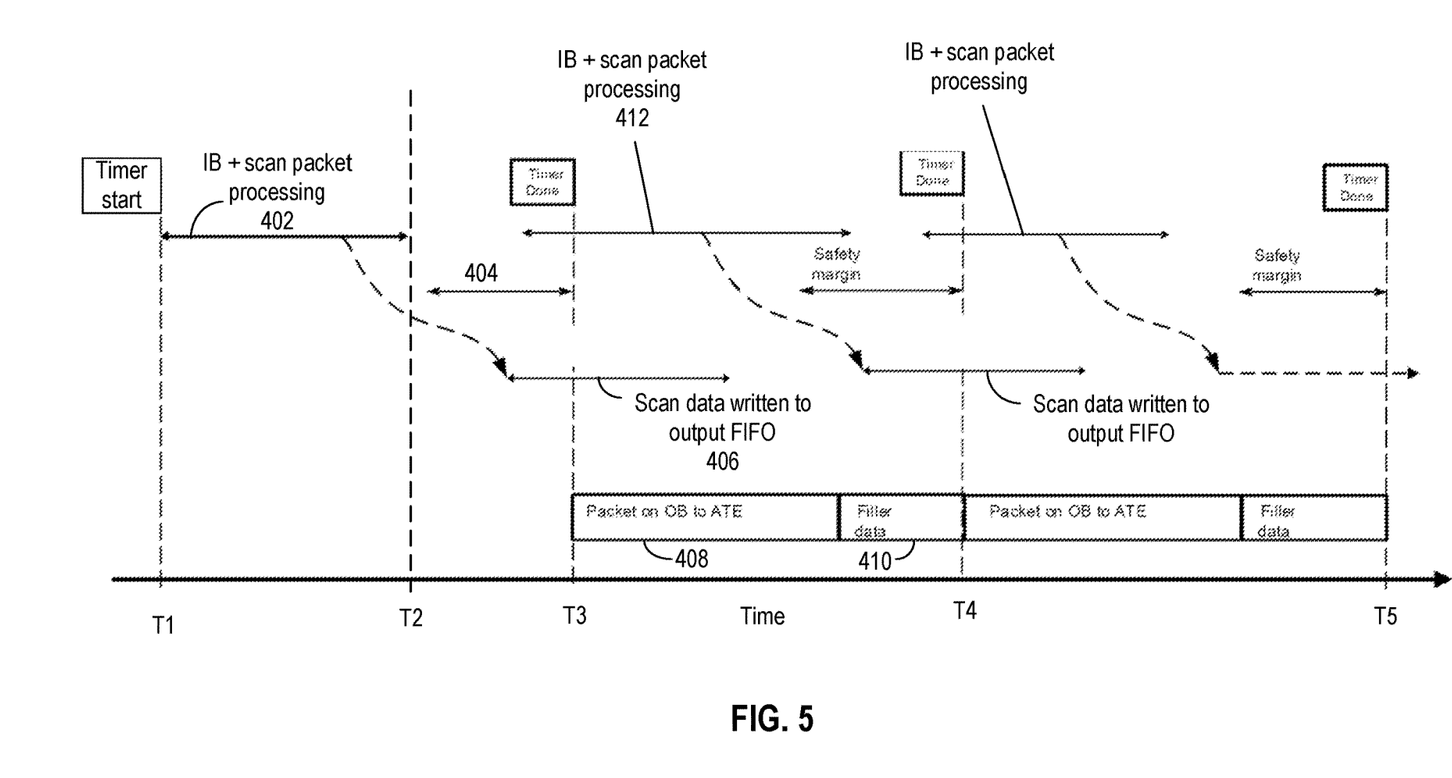

FIGS. 4-5 illustrate a timing diagram with deterministic latency in accordance with some embodiments described herein. The X-axis in FIGS. 4-5 corresponds to time.

In FIG. 4, at time T1, a timer circuit may be started, and inbound and scan packet processing 402 may be performed, which may complete at time T2. Safety margin 404 may be a time duration between the end of inbound and scan packet processing 402 (at time T2) and the beginning of writing scan response data to output FIFO 328 (at 406). In FIG. 4, a small delay is shown between the time the scan response packet starts to be written to output FIFO 328 and time T3 when the scan response packet begins transmission to the ATE (at 408). The response packet may end transmission before the next response packet is transmitted, and the gap between two response packets may be filled using filler data 410 (which is interpreted by the ATE as such). Safety margin 404 may be adjusted by increasing or decreasing the timer duration. Specifically, the system may determine the desired safety margin 404 and set the timer register value accordingly.

Deterministic latency is achieved because read FIFO control circuit 330 guarantees that the ATE receives response packets at fixed intervals. Specifically, read FIFO control circuit 330 achieves this by reading data from output FIFO 328 at fixed intervals.

During a test run, the ATE (e.g., ATE 102) may execute a training procedure during which the high speed I/O interface with the DUT (e.g., DUT 104) is initialized. After training, the ATE may begin transmitting test pattern packets to the DUT. Meanwhile, the ATE may monitor the data received from the DUT to detect the first response packet. After the first response packet has been received, the ATE can expect to receive every subsequent response packet in the test run at guaranteed and fixed time intervals.

In some embodiments described herein, the reference clock for the ATE and the DUT may be the same. The amount of data that is read from the output FIFO 328 may be programmable. For example, the amount of data may be determined by a value stored in a register which may be initialized during an initial setup phase. The outbound path may be isolated from the inbound path. Any bubbles (e.g., absence of useful data) on the inbound path may not affect timing if the output FIFO 328 in the outbound path is never empty. In general, safety margin 404 may be increased to ensure that output FIFO 328 is never empty and decreased to improve performance (reducing safety margin 404 increases the packet throughput of the system).

At time T3, the timer circuit may be restarted, and inbound and scan packet processing 412 for the next test pattern packet may be performed. The resulting scan response packet may begin transmission at time T4 when the timer expires and is restarted again.

FIG. 5 illustrates how variations in the inbound traffic processing times does not affect the deterministic transmission of response packets in the outbound path. Specifically, in FIG. 5, scan response data is written to output FIFO 328 (at 406) sooner than it was in FIG. 4. However, the response packet transmission still begins at a fixed time, e.g., time T3. Additionally, in FIG. 5, the time used to process the first test pattern packet (e.g., inbound and scan packet processing 402) is less than the time used to process the second test pattern packet (e.g., inbound and scan packet processing 412). However, this difference does not impact the deterministic response packet transmission schedule. Specifically, the first response packet is transmitted at time T3 and the second response packet is transmitted at time T4, where the time duration between time T1 and T3 is equal to the time duration between time T3 and T4.

In some embodiments described herein, test packets may be received from an ATE, where the test packets may include test pattern data to test a DUT. Specifically, the test packets may be received over a SERDES connection between the ATE and the DUT, where the SERDES connection may include one or more high speed I/O lanes. For example, in FIG. 1, test packets may be received from ATE 102 over a SERDES connection, which may include high speed I/O lanes 106.

A circuit in the DUT may apply the test pattern data to the DUT using a set of scan chains to obtain test response data corresponding to the test pattern data. For example, in FIG. 1, controller 110 may apply the test pattern data to DUT 104 by using scan chain circuit 112. Scan chain circuit 112 may capture response data corresponding to the test pattern data (the test response data may be received by controller 110 from scan chain circuit 112). The test response data may be received by controller 110 at irregular time intervals. For example, in FIG. 3, controller circuit 300 may correspond to controller 110, and the test response data may be received at output FIFO 328 at irregular intervals. Next, the circuit in the DUT may send the response packets (which include a portion of the test response data) to the ATE at regular time intervals, where the response packets may be sent to the ATE over the SERDES connection. The term "portion of the test response data" may include the entire test response data or only a subset of the test response data. For example, at regular time intervals, read FIFO control circuit 330 in FIG. 3 may read a portion of test response data from output FIFO 328, packetize the portion of the test response data, and send the packetized portion of the test response data (e.g., the response packets) to the ATE.

In some embodiments described herein, the response packets may include encoded test response data which is obtained by encoding the portion of the test response data. For example, in FIG. 3, encoding circuit 334 may encode the portion of the test response data. The encoding may map a first set of bits to a second set of bits, where the number of bits in the second set of bits is greater than the number of bits in the first set of bits, where each bit in the first set of bits is mapped to one or more corresponding bits in the second set of bits, and where a don't care bit in the first set of bits is mapped to corresponding one or more don't care bits in the second set of bits. In these embodiments, the ATE may directly compare the encoded test response data with a corresponding encoded expected response data.

In some embodiments described herein, the regular time intervals are determined based on a timer circuit in the DUT. For example, in FIG. 3, read FIFO control circuit 330 may use a timer circuit to determine when to generate response packets, which then deterministically determines when the response packet begins transmission to the ATE. As shown in FIGS. 4-5, transmission of response packets may begin at times T3 and T4 based on the timer circuit.

In some embodiments described herein, a configuration packet may be received from the ATE, where the configuration packet may include a timer value. The timer value may be used to configure and/or program the timer circuit (e.g., by storing the timer value in a register associated with the timer circuit). For example, packet processing and control circuit 312 may determine that a received packet is a configuration packet. Next, packet processing and control circuit 312 may extract the timer value from configuration packet and configure and/or program the timer circuit based on the extracted timer value (e.g., by storing the extracted timer value in a register associated with the timer circuit). The timer value may include a safety margin (e.g., safety margin 440 shown in FIGS. 4-5) which may be based on an amount of irregularity of the irregular time intervals. Specifically, if the test response data is expected to be received at very irregular time intervals, then a larger safety margin may be used. A configuration packet may also include a response data size value. The portion of the test response data may be determined based on the response data size value. Specifically, in FIG. 3, test response data may be dumped into output FIFO 328 at irregular intervals. However, only the portion of test response data that is to be included in the next response packet may be read by read FIFO control circuit 330. The amount of data that is to be read may be configured based on the response data size value received in a configuration packet.

Figure 6:
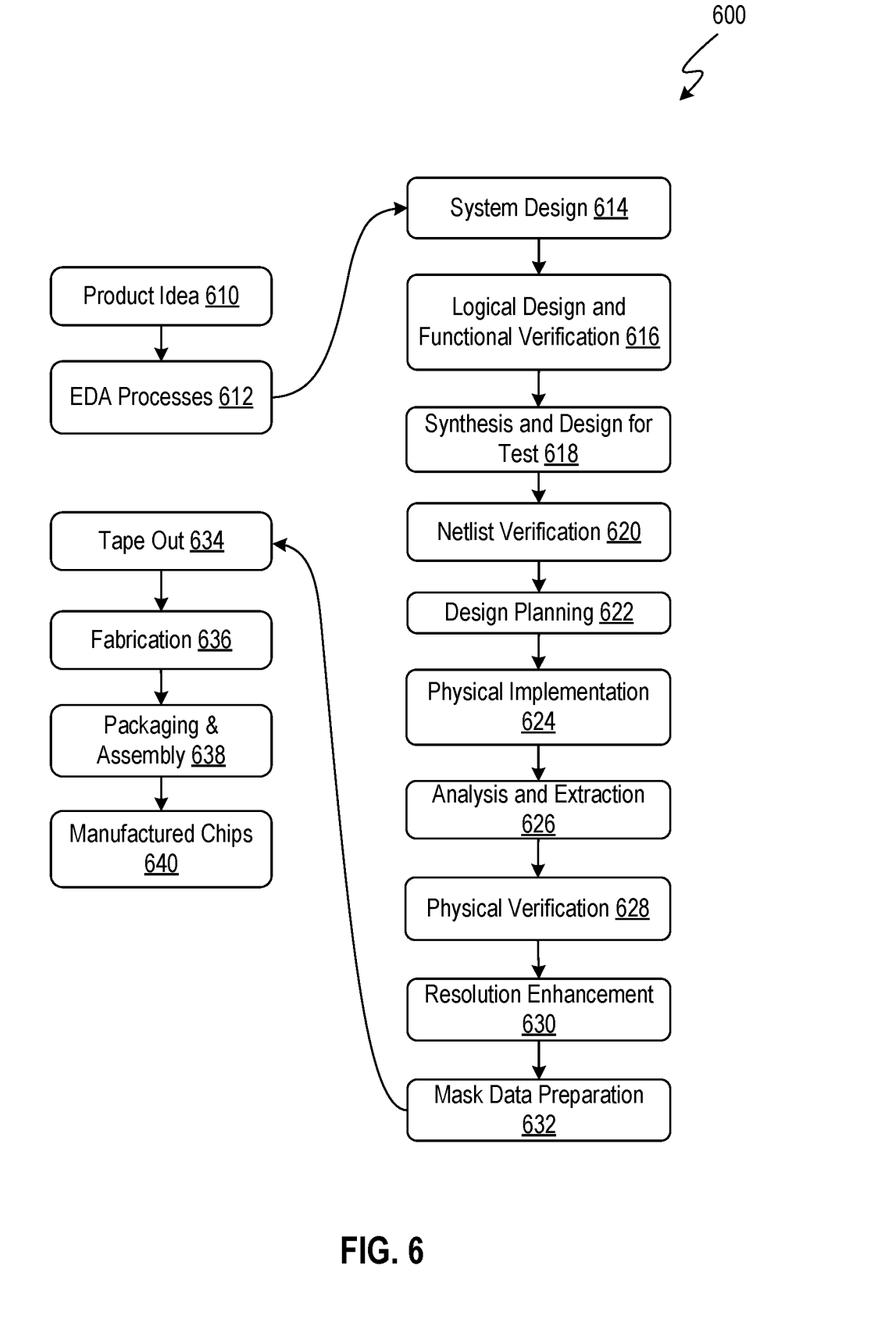
FIG. 6 illustrates an example flow for the design, verification, and fabrication of an integrated circuit in accordance with some embodiments described herein.

FIG. 6 illustrates an example flow for the design, verification, and fabrication of an integrated circuit in accordance with some embodiments described herein.

EDA processes 612 (the acronym "EDA" refers to "Electronic Design Automation") can be used to transform and verify design data and instructions that represent the integrated circuit. Each of these processes can be structured and enabled as multiple modules or operations.

Flow 600 can start with the creation of a product idea 610 with information supplied by a designer, information which is transformed and verified by using EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly 638 are performed to produce the manufactured IC chip 640.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 in FIG. 7) may be used to store the programs and data structures that are used by some or all of the EDA products described herein, and products used for development of cells for the library and for physical and logical design that use the library.

Figure 7:
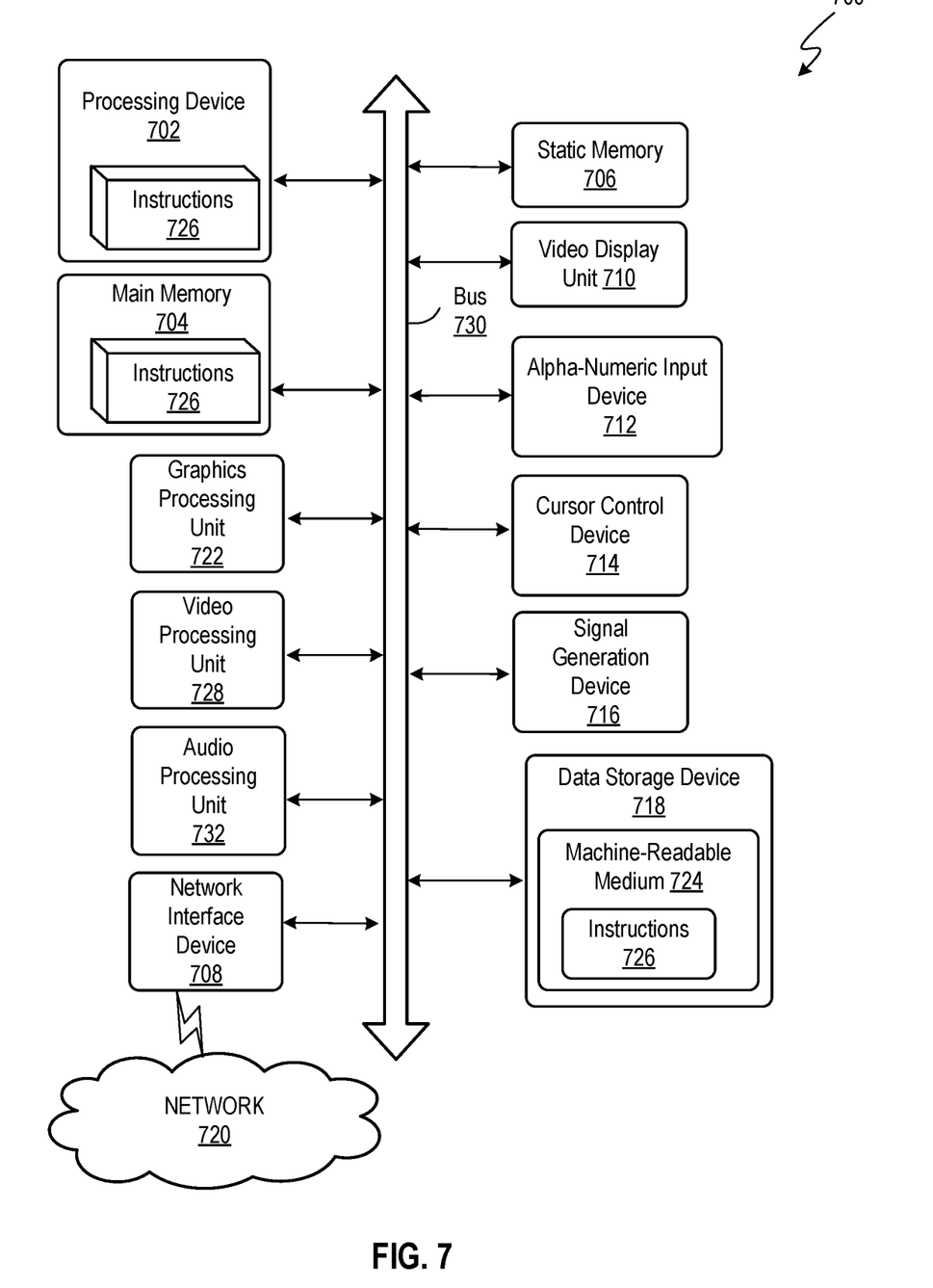
FIG. 7 illustrates an example machine of a computer system within which a set of instructions, for causing the machine to perform any one or more of the methodologies discussed herein, may be executed in accordance with some embodiments described herein.

FIG. 7 illustrates an example machine of a computer system 700 within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various design modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
receiving, from an automated test equipment (ATE), test packets comprising test pattern data to test a design under test (DUT), wherein the test packets are received over a serializer/deserializer (SERDES) connection between the ATE and the DUT;
applying, by a circuit in the DUT, the test pattern data to the DUT using a set of scan chains and obtaining test response data corresponding to the test pattern data;
receiving, by the circuit in the DUT, the test response data at irregular time intervals; and
sending, by the circuit in the DUT, response packets comprising a portion of the test response data to the ATE at regular time intervals, wherein the response packets are sent to the ATE over the SERDES connection.

2. The method of claim 1, wherein the SERDES connection comprises one or more high speed input/output (I/O) lanes.

3. The method of claim 1, wherein the response packets comprise encoded test response data which is obtained by encoding the portion of the test response data, wherein the encoding maps a first set of bits to a second set of bits, wherein the number of bits in the second set of bits is greater than the number of bits in the first set of bits, wherein each bit in the first set of bits is mapped to one or more corresponding bits in the second set of bits, and wherein a don't care bit in the first set of bits is mapped to corresponding one or more don't care bits in the second set of bits.

4. The method of claim 3, further comprising comparing, by the ATE, the encoded test response data with a corresponding encoded expected response data.

5. The method of claim 1, wherein the regular time intervals are controlled by a timer circuit in the DUT.

6. The method of claim 5, further comprising:
receiving, from the ATE, a configuration packet comprising a timer value corresponding to the regular time intervals; and
programming, by the circuit in the DUT, the timer circuit based on the timer value.

7. The method of claim 6, wherein the timer value includes a safety margin which is based on an amount of irregularity of the irregular time intervals.

8. The method of claim 1, further comprising:
receiving, from the ATE, a configuration packet comprising a response data size value; and
determining, by the circuit in the DUT, the portion of the test response data based on the response data size value.

9. A circuit, comprising:
a first circuit to receive, from an automated test equipment (ATE), test packets comprising test pattern data to test a design under test (DUT), wherein the test packets are received over a serializer/deserializer (SERDES) connection between the ATE and the DUT;
a second circuit to apply the test pattern data to the DUT using a set of scan chains and obtain test response data corresponding to the test pattern data;
a third circuit to receive the test response data at irregular time intervals; and a fourth circuit to send response packets comprising a portion of the test response data to the ATE at regular time intervals, wherein the response packets are sent to the ATE over the SERDES connection.

10. The circuit of claim 9, wherein the SERDES connection comprises one or more high speed input/output (I/O) lanes.

11. The circuit of claim 9, wherein the response packets comprise encoded test response data which is obtained by encoding the portion of the test response data, wherein the encoding maps a first set of bits to a second set of bits, wherein the number of bits in the second set of bits is greater than the number of bits in the first set of bits, wherein each bit in the first set of bits is mapped to one or more corresponding bits in the second set of bits, and wherein a don't care bit in the first set of bits is mapped to corresponding one or more don't care bits in the second set of bits.

12. The circuit of claim 9, comprising a fifth circuit to determine the regular time intervals.

13. The circuit of claim 12, wherein the fifth circuit is configured based on a timer value received in a configuration packet, wherein the timer value corresponds to the regular time intervals, and wherein the configuration packet is received from the ATE by the first circuit.

14. The circuit of claim 13, wherein the timer value includes a safety margin which is based on an amount of irregularity of the irregular time intervals.

15. The circuit of claim 9, wherein the portion of the test response data is determined based on a response data size value received in a configuration packet, wherein the configuration packet is received from the ATE by the first circuit.

16. A serializer/deserializer (SERDES)-based design for test (DFT) system, comprising:
  an automated test equipment (ATE) to send test packets comprising test pattern data to a design under test (DUT) coupled to the ATE via a SERDES connection; the DUT, comprising:
  a first circuit to receive the test packets comprising the test pattern data;
  a second circuit to apply the test pattern data to the DUT using a set of scan chains and obtain test response data corresponding to the test pattern data;
  a third circuit to receive the test response data at irregular time intervals; and
  a fourth circuit to send response packets to the ATE at regular time intervals, wherein the response packets include encoded test response data obtained by encoding a portion of the test response data; and
  wherein the ATE receives the encoded test response data and compares the encoded test response data with encoded expected response data.

17. The SERDES-based DFT system of claim 16, wherein the SERDES connection comprises one or more high speed input/output (I/O) lanes.

18. The SERDES-based DFT system of claim 16, wherein the encoding maps a first set of bits to a second set of bits, wherein the number of bits in the second set of bits is greater than the number of bits in the first set of bits, wherein each bit in the first set of bits is mapped to one or more corresponding bits in the second set of bits, and wherein a don't care bit in the first set of bits is mapped to corresponding one or more don't care bits in the second set of bits.

19. The SERDES-based DFT system of claim 16, wherein the DUT comprises a fifth circuit to determine the regular time intervals.

20. The SERDES-based DFT system of claim 19, wherein the fifth circuit is configured based on a timer value received in a configuration packet, wherein the timer value corresponds to the regular time intervals, and wherein the configuration packet is received from the ATE by the first circuit.

* * * * *